United States Patent
Uno

(10) Patent No.: US 10,168,617 B2
(45) Date of Patent: Jan. 1, 2019

(54) COMPOSITION FOR FORMING INTERLAYER INSULATING FILM, INTERLAYER INSULATING FILM, METHOD FOR FORMING INTERLAYER INSULATING FILM PATTERN, AND DEVICE

(71) Applicant: TOKYO OHKA KOGYO CO., LTD., Kawasaki-shi (JP)

(72) Inventor: Kazuhide Uno, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/469,277

(22) Filed: Mar. 24, 2017

(65) Prior Publication Data
US 2017/0285473 A1    Oct. 5, 2017

(30) Foreign Application Priority Data

Mar. 31, 2016  (JP) ................ 2016-073321

(51) Int. Cl.
| | |
|---|---|
| *C09D 4/00* | (2006.01) |
| *C09D 5/00* | (2006.01) |
| *G03F 7/16* | (2006.01) |
| *G03F 7/20* | (2006.01) |
| *G03F 7/32* | (2006.01) |
| *G03F 7/40* | (2006.01) |
| *G03F 7/027* | (2006.01) |
| *G03F 7/031* | (2006.01) |
| *G03F 7/035* | (2006.01) |
| *G03F 7/038* | (2006.01) |
| *H01L 21/02* | (2006.01) |
| *C08F 220/28* | (2006.01) |
| *C08F 222/22* | (2006.01) |
| *H01L 21/027* | (2006.01) |
| *H01L 21/311* | (2006.01) |

(52) U.S. Cl.
CPC ............ *G03F 7/031* (2013.01); *C09D 4/00* (2013.01); *C09D 5/00* (2013.01); *G03F 7/027* (2013.01); *G03F 7/035* (2013.01); *G03F 7/0388* (2013.01); *G03F 7/162* (2013.01); *G03F 7/168* (2013.01); *G03F 7/2004* (2013.01); *G03F 7/322* (2013.01); *G03F 7/40* (2013.01); *H01L 21/0274* (2013.01); *H01L 21/02118* (2013.01); *H01L 21/02282* (2013.01); *H01L 21/311* (2013.01)

(58) Field of Classification Search
CPC ........ G03F 7/0388; G03F 7/035; G03F 7/027; G03F 7/038; G03F 7/40; G03F 7/322; G03F 7/2004; G03F 7/168; G03F 7/162; C09D 175/14; C09D 5/00; C09D 4/00; C08F 2/48; C08F 2/50; C08F 4/00; C08F 2220/1875; C08F 220/18; C08F 220/14; C08F 220/06; C08F 2222/1013; C08F 2222/1026; C08F 290/147; H01L 21/0274; H01L 23/3157–23/3192
See application file for complete search history.

(56) References Cited

U.S. PATENT DOCUMENTS

| | | | |
|---|---|---|---|
| 4,587,317 A | 5/1986 | Renner | |
| 4,678,849 A | 7/1987 | Liu et al. | |
| 4,885,346 A | 12/1989 | Kramer et al. | |
| 4,966,923 A | 10/1990 | Banks et al. | |
| 2013/0143164 A1 | 6/2013 | Yabuki et al. | |
| 2017/0285472 A1* | 10/2017 | Uno | ................ C09D 5/00 |
| 2017/0285473 A1 | 10/2017 | Uno | |

FOREIGN PATENT DOCUMENTS

| | | |
|---|---|---|
| JP | A-2007-031511 | 2/2007 |
| JP | A-2008-040183 | 2/2008 |
| JP | A-2011-180472 | 9/2011 |

OTHER PUBLICATIONS

Office Action in U.S. Appl. No. 15/467,793, dated Mar. 22, 2018.

* cited by examiner

*Primary Examiner* — Cynthia Hamilton
(74) *Attorney, Agent, or Firm* — Knobbe Martens Olson & Bear LLP

(57) ABSTRACT

A composition for forming an interlayer insulating film including a polymerizable monomer, an imide compound represented by general formula (z-1), a reaction promoter which promotes the polymerization of the polymerizable monomer and the imide compound, and a polymerization initiator, an interlayer insulating film containing a polymerized product thereof, a method for forming an interlayer insulating film pattern, and a device including the interlayer insulating film on a support. In the formula (z-1), $R^1$ and $R^2$ represent a hydrogen atom or an alkyl group having 1 to 5 carbon atoms. $R_z^{00}$ represents a divalent organic group containing an aliphatic hydrocarbon group and/or an aromatic hydrocarbon group, $R_z^{01}$ and $R_z^{02}$ represent an alkyl group or an alkoxy group, and $n_1$ and $n_2$ are 0 or 1.

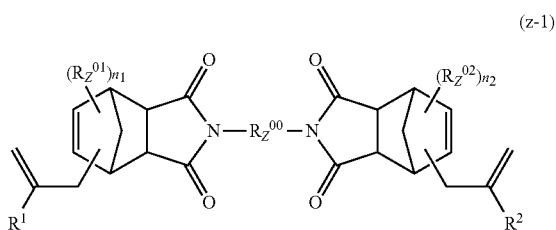

(z-1)

13 Claims, No Drawings

COMPOSITION FOR FORMING INTERLAYER INSULATING FILM, INTERLAYER INSULATING FILM, METHOD FOR FORMING INTERLAYER INSULATING FILM PATTERN, AND DEVICE

RELATED APPLICATION

This application claims priority to Japanese Patent Application No. 2016-073321 filed Mar. 31, 2016, the entire content of which is hereby incorporated by reference.

BACKGROUND OF THE INVENTION

Field of the Invention

The present invention relates to a composition for forming an interlayer insulating film, an interlayer insulating film, a method for forming an interlayer insulating film pattern, and a device.

Background Art

In recent years, as semiconductor devices have become more highly integrated and larger, there is a demand for thinner and smaller package substrates. In accordance with this, an interlayer insulating film of a package substrate including a surface protective layer, an interlayer insulating film, or a rewiring layer of the semiconductor device has been required to be formed with a material having more excellent electrical properties, heat resistance, and mechanical properties.

A polyimide resin (hereinafter, referred to as "PI") and polybenzoxazole (hereinafter, referred to as "PBO") are representative materials which may satisfy such required properties, and for example, the use of a photosensitive PI or a photosensitive PBO obtained by imparting photosensitivity to PI or PBO is considered.

When these photosensitive resins are used, there is an advantage that pattern forming steps are simplified and thus complicated manufacturing steps can be shortened. In addition, these photosensitive resins have improved heat resistance and insulation resistance as compared with a vinyl-based photosensitive resin of the related art which enables alkali developing by the introduction of a carboxy group, and are effectively used as the above-described interlayer insulating film (for example, refer to Japanese Unexamined Patent Application, Publication No. 2011-180472 and Japanese Unexamined Patent Application, Publication No. 2007-031511).

On the other hand, the photosensitive PI and the photosensitive PBO have problems that it is required to be baked at a high temperature (350° C. to 400° C.), and it has low exposure stability, large film reduction of a formed resin film, and low solvent solubility.

In contrast, an interlayer insulating film obtained by using a photosensitive acrylic resin having a good handleability and a high heat resistance has been proposed (refer to Japanese Unexamined Patent Application, Publication No. 2008-040183).

SUMMARY OF THE INVENTION

However, the interlayer insulating film obtained by using the above-described photosensitive acrylic resin is required to have further improved mechanical properties (fracture elongation, and the like).

The present invention has been made in consideration of the above described circumstance, and an object thereof is to provide a material with which a reaction temperature can be more reduced and an interlayer insulating film having further improved mechanical properties, especially fracture elongation, can be formed.

According to a first aspect of the present invention, there is provided a composition for forming an interlayer insulating film, containing a polymerizable monomer (M), an imide compound (Z) represented by the following general formula (z-1), a reaction promoter (A) which promotes the polymerization of the polymerizable monomer (M) and the imide compound (Z), and a polymerization initiator.

[Chemical Formula 1.]

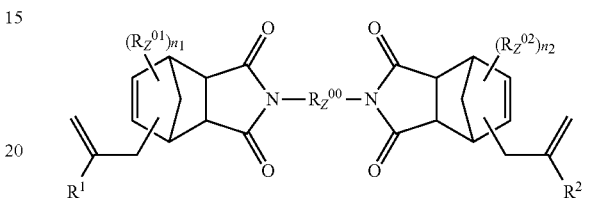

(z-1)

In the formula, $R^1$ and $R^2$ each independently represent a hydrogen atom or an alkyl group having 1 to 5 carbon atoms, $R_z^{00}$ represents a divalent organic group containing a linear, branched, or cyclic aliphatic hydrocarbon group, and/or an aromatic hydrocarbon group, $R_z^{01}$ and $R_z^{02}$ each independently represent an alkyl group having 1 to 5 carbon atoms or an alkoxy group having 1 to 5 carbon atoms, and $n_1$ and $n_2$ each independently represent 0 or 1.

According to a second aspect of the present invention, there is provided an interlayer insulating film containing a polymerized product of the composition for forming an interlayer insulating film according to the first aspect.

According to a third aspect of the present invention, there is provided a method for forming an interlayer insulating film pattern, including a step (i) of applying the composition for forming an interlayer insulating film according to the first aspect on a support to form a coated film; a step (ii) of exposing the coated film; a step (iii) of alkali developing the coated film after the exposing to form a pre-pattern; and a step (iv) of curing the pre-pattern with heat to obtain an interlayer insulating film pattern.

According to a fourth aspect of the present invention, there is provided a device including a support having thereon the interlayer insulating film according to the second aspect.

According to the present invention, it is possible to provide a composition with which a reaction temperature can be more reduced and an interlayer insulating film having further improved mechanical properties, especially fracture elongation, can be formed.

Particularly, according to the present invention, it is possible to form an interlayer insulating film having significantly improved fracture elongation.

DETAILED DESCRIPTION OF THE INVENTION

In the specification and claims of the present application, "aliphatic" is a relative concept with respect to aromatics, and is defined as a group, a compound, or the like having no aromaticity.

"Alkyl group" includes a linear, branched, or cyclic monovalent saturated hydrocarbon group unless otherwise noted. The same is applicable to an alkyl group in an alkoxy group.

"Alkylene group" includes a linear, branched, and cyclic divalent saturated hydrocarbon group unless otherwise noted.

"Halogenated alkyl group" is a group obtained by substituting a portion or all of hydrogen atoms of the alkyl group with a halogen atom, and examples of the halogen atom include a fluorine atom, a chlorine atom, a bromine atom, and an iodine atom.

"Structural unit" means a monomer unit for constituting a polymer compound (a resin, a polymer, or a copolymer).

The phrase "may have a substituent" means both a case of substituting a hydrogen atom (—H) with a monovalent group and a case of substituting a methylene group (—CH$_2$—) with a divalent group.

"Exposure" is a concept including radiation irradiation in general.

"(Meth)acrylate" means one or both of acrylate and methacrylate.

Hereinafter, embodiments according to the respective aspects of the present invention will be specifically described; however, the present invention is not limited to the following embodiments, and can be implemented with appropriate modification within the scope of the object of the present invention.

Composition for Forming Interlayer Insulating Film

The embodiment according to the first aspect of the present invention is a composition for forming an interlayer insulating film which contains a polymerizable monomer (M), an imide compound (Z) represented by the following general formula (z-1), a reaction promoter (A) which promotes the polymerization of the polymerizable monomer (M), the imide compound (Z), and a polymerization initiator.

Polymerizable Monomer (M)

Examples of a polymerizable monomer (M) (hereinafter, also referred to as "(M) component") to be contained in the composition for forming an interlayer insulating film of the embodiment include a compound having a polymerizable group.

Examples of the polymerizable group include an unsaturated double bond functional group such as a vinyl group, an allyl group, an acryloyl group, and a methacryloyl group; and an unsaturated triple bond functional group such as a propargyl group. Among them, a vinyl group, an acryloyl group, and a methacryloyl group are preferable from the viewpoint that polymerization easily proceeds.

The number of the polymerizable group (an unsaturated multiple bond functional group) which the compound has is preferably 1 to 6, is further preferably 2 to 5, is still further preferably 3 to 5, and is particularly preferably 3. In a case where the compound has plural polymerizable groups, the polymerizable groups may be the same as or different from each other.

The (M) component is appropriately selected in accordance with required properties, and examples thereof include a monomer being photopolymerizable, and a monomer being thermally polymerizable.

Examples of the (M) component include a compound obtaining by causing polyhydric alcohol and α,β-unsaturated carboxylic acid to react with each other, a compound obtaining by causing a glycidyl group-containing compound and α,β-unsaturated carboxylic acid to react with each other, a nonylphenyl dioxylene (meth)acrylate compound, a γ-chloro-β-hydroxypropyl-β'-(meth)acryloyloxyethyl-o-phthalate compound, a β-hydroxyethyl-β'-(meth)acryloyloxyethyl-o-phthalate compound, a β-hydroxypropyl-β'-(meth)acryloyloxyethyl-o-phthalate compound, an alkyl (meth)acrylate compound, an ethylene oxide (EO) modified nonylphenyl (meth)acrylate compound, a bisphenol A type (meth)acrylate compound, a compound represented by general formula (m-1) which will be described below, and a urethane monomer such as a (meth)acrylate compound having a urethane bond.

Examples of the compound obtained by causing polyhydric alcohol and α,β-unsaturated carboxylic acid to react with each other include polyethylene glycol di(meth)acrylate having 2 to 14 ethylene groups, polypropylene glycol di(meth)acrylate having 2 to 14 propylene groups, trimethylolpropane di(meth)acrylate, trimethylolpropane tri(meth)acrylate, trimethylolpropane ethoxy tri(meth)acrylate, trimethylolpropane diethoxy tri(meth)acrylate, trimethylolpropane triethoxy tri(meth)acrylate, trimethylolpropane tetraethoxy tri(meth)acrylate, trimethylolpropane pentaethoxy tri(meth)acrylate, tetramethylolmethane tri(meth)acrylate, tetramethylolmethane tetra(meth)acrylate, dipentaerythritol penta(meth)acrylate, and dipentaerythritol hexa(meth)acrylate. Examples thereof further include other commercially available monomer such as bifunctional (meth)acrylate or polyfunctional (meth)acrylate manufactured by Shin-Nakamura Chemical Co., Ltd., or LIGHT ESTER series manufactured by Kyoeisha Chemical Co., Ltd.

Examples of the compound obtained by causing the glycidyl group-containing compound and α,β-unsaturated carboxylic acid to react with each other include ethylene glycol diglycidyl ether di(meth)acrylate, diethylene glycol diglycidyl ether di(meth)acrylate, phthalic acid diglycidyl ester di(meth)acrylate, glycerin tri(meth)acrylate, and glycerin polyglycidyl ether poly(meth)acrylate.

Examples of the bisphenol A type (meth)acrylate compound include 2,2-bis(4-((meth)acryloxy polyethoxy) phenyl) propane, 2,2-bis(4-((meth)acryloxy polypropoxy) phenyl) propane, 2,2-bis(4-((meth)acryloxy polybutoxy) phenyl) propane, and 2,2-bis(4-((meth)acryloxy polyethoxy polypropoxy) phenyl) propane.

The compound represented by general formula (m-1) is indicated as follows.

[Chemical Formula 2.]

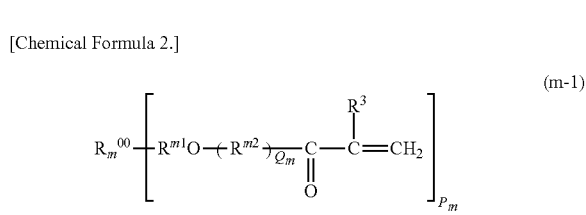

In the formula, $R_m^{00}$ represents an organic group having a valence of $P_m$. $P_m$ is an integer of 1 to 6, $R^3$ represents a hydrogen atom or an alkyl group having 1 to 5 carbon atoms, $R^{m1}$ represents an alkylene group having 1 to 5 carbon atoms, $R^{m2}$ represents a modified group, and $Q_m$ is 0 or 1.

In the formula (m-1), $R_m^{00}$ represents an organic group having a valence of $P_m$.

Examples of the organic group represented by $R_m^{00}$ include a chain or cyclic hydrocarbon group which may have a substituent. The hydrocarbon group in $R_m^{00}$ may be an aliphatic hydrocarbon group or may be an aromatic hydrocarbon group, and the aliphatic hydrocarbon group is preferable. Among them, preferred examples of $R_m^{00}$ include a cycloalkylene group which may have a substituent.

The number of carbon atoms of the cycloalkylene group is preferably 3 to 8, more preferably 6 (that is, a cyclohexylene group —C$_6$H$_{10}$—), and particularly preferably a 1,4-cyclohexylene group.

Examples of the substituent which the cycloalkylene group may have include a halogen atom, an alkyl group having 1 to 20 carbon atoms, a cycloalkyl group having 3 to 10 carbon atoms, an aryl group having 6 to 18 carbon atoms, a phenacyl group, an amino group, an alkyl amino group having 1 to 10 carbon atoms, a dialkyl amino group having 2 to 20 carbon atoms, a nitro group, a cyano group, an oxo group, a mercapto group, an alkyl mercapto group having 1 to 10 carbon atoms, an allyl group, a hydroxyl group, a hydroxyalkyl group having 1 to 20 carbon atoms, a carboxy group, a carboxy alkyl group including an alkyl group having 1 to 10 carbon atoms, an acyl group including an alkyl group having 1 to 10 carbon atoms, an alkoxyl group having 1 to 20 carbon atoms, an alkoxy carbonyl group having 1 to 20 carbon atoms, an alkyl carbonyl group having 2 to 10 carbon atoms, an alkenyl group having 2 to 10 carbon atoms, an N-alkyl carbamoyl group having 2 to 10 carbon atoms or a group containing a heterocyclic ring, or an aryl group which is substituted with any one of the substituents. The substituent may form a condensed ring. In addition, the hydrogen atom in the substituents may be substituted with the above-described substituent such as a halogen atom. In addition, in a case where the number of the substituents is two or more, two or more substituents may be the same as or different from each other.

Alternatively, a carbon atom which forms the cycloalkylene group may be substituted with other atoms (an oxygen atom, a sulfur atom, a nitrogen atom, and the like).

Hereinafter, preferred examples of $R_m^{00}$ are specifically described. A symbol of "*" in the formula indicates a bond which is bonded to $R^{m1}$ in the formula (m-1).

In the formula (m-1), $P_m$ is an integer of 1 to 6, preferably 2 to 5, more preferably 2 or 3, and particularly preferably 3.

[Chemical Formula 3.]

$(R_m^{00}\text{-}1)$

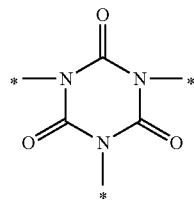

$(R_m^{00}\text{-}2)$

In the formula (m-1), $R^3$ represents a hydrogen atom or an alkyl group having 1 to 5 carbon atoms. Preferred examples of the alkyl group having 1 to 5 carbon atoms include a linear or branched alkyl group having 1 to 5 carbon atoms, specifically, a methyl group, an ethyl group, a propyl group, an isopropyl group, an n-butyl group, an isobutyl group, a tert-butyl group, a pentyl group, an isopentyl group, and a neopentyl group. Among them, the methyl group and the ethyl group are preferable, and the methyl group is further preferable.

In the above-described formula (m-1), $R^{m1}$ represents an alkylene group having 1 to 5 carbon atoms. As the alkylene group having 1 to 5 carbon atoms, an alkylene group having 1 to 3 carbon atoms is preferable, and a methylene group and an ethylene group are further preferable.

In the formula (m-1), $R^{m2}$ represents a modified group. Examples of the modified group represented by $R^{m2}$ include an oxyethylene group ($-OC_2H_4-$), an oxypropylene group ($-OC_3H_6-$), and a caprolactone group ($-OC_5H_{10}C(=O)-$). Among $R^{m2}$, the caprolactone group ($-OC_5H_{10}C(=O)-$) is preferable from the viewpoint that the effect of the present invention can be more easily obtained. That is, the caprolactone modification is preferable.

In the formula (m-1), $Q_m$ is 0 or 1, and is preferably 1.

Preferred examples of the compound represented by the general formula (m-1) are shown below.

[Chemical Formula 4.]

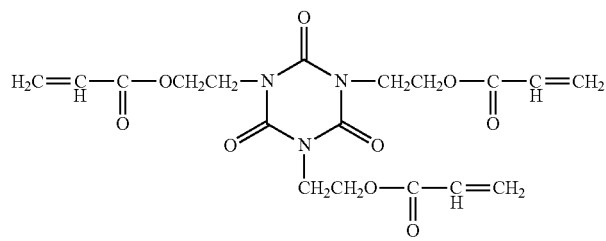

(m-1-1)

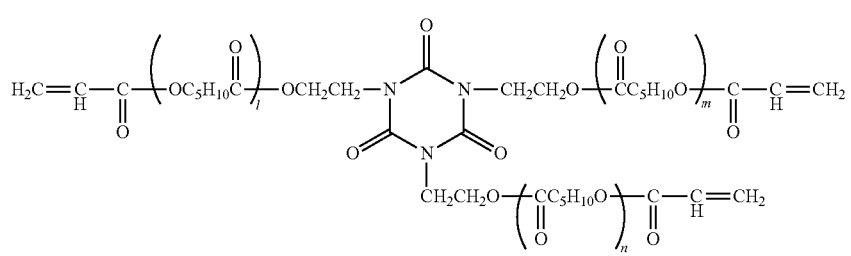

(m-1-2)

With respect to the urethane monomer, preferred examples of the (meth)acrylate compound having a urethane bond include a polymerizable monomer (urethane (meth)acrylate) having a urethane bond (—NH—CO—O—) and a (meth)acryloyloxy group in the molecule. Among them, urethane (meth)acrylate having three or more functional groups is further preferable.

The urethane (meth)acrylate having three or more functional groups means the urethane (meth)acrylate having a urethane bond (—NH—CO—O—) and three or more (meth)acryloyloxy groups in the molecule. The number of the functional groups in the urethane (meth)acrylate is preferably 3 or more, is further preferably 3 to 10, is still further preferably 3 to 5, is particularly preferably 3 or 4, and is most preferably 3 (that is, urethane (meth)acrylate having three functional groups).

Preferred examples of the urethane (meth)acrylate include a compound represented by the following general formula (m-2).

[Chemical Formula 5.]

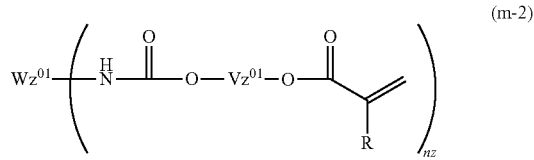

(m-2)

In the formula, R represents a hydrogen atom or a methyl group, $Vz^{01}$ represents a divalent linking group containing a group derived from polyol, $Wz^{01}$ represents a trivalent or higher-valent organic group, and nz is a number of 3 or more.

In the above-described formula (m-2), $Vz^{01}$ represents a divalent linking group containing a group derived from polyol.

Preferred examples of $Vz^{01}$ representing a divalent linking group containing a group derived from polyol are shown below. The symbol of "*" in the formula represents a bond which is bonded to an oxygen atom.

[Chemical Formula 6.]

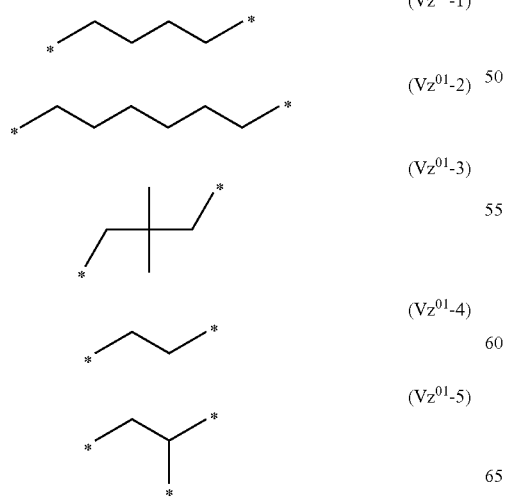

(Vz$^{01}$-1)

(Vz$^{01}$-2)

(Vz$^{01}$-3)

(Vz$^{01}$-4)

(Vz$^{01}$-5)

-continued

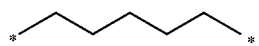

(Vz$^{01}$-6)

In the formula (m-2), $Wz^{01}$ represents a trivalent or higher-valent organic group.

Here, examples of the organic group include a group derived from a moiety other than —N═C═O in a polyisocyanate compound.

Preferred examples of $Wz^{01}$ representing a trivalent or higher-valent organic group are shown below. The symbol of "*" in the formula represents a bond which is bonded to a nitrogen atom

[Chemical Formula 7.]

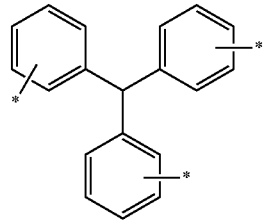

(Wz$^{01}$-1)

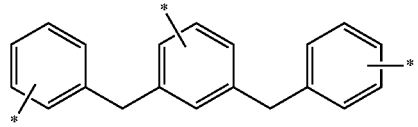

(Wz$^{01}$-2)

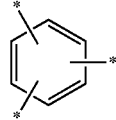

(Wz$^{01}$-3)

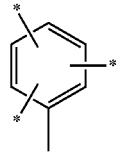

(Wz$^{01}$-4)

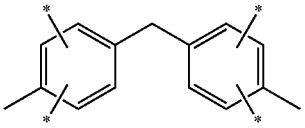

(Wz$^{01}$-5)

In the above-described formula (m-2), nz is a number of 3 or more, preferably 3 to 10, further preferably 3 to 5, still further preferably 3 or 4, and particularly preferably 3 (that is, the number of the functional groups is 3).

The urethane (meth)acrylate having three functional groups can be compounded by using commercially available products. For example, commercially available products such as CN929, CN944B85, CN989, and CN9008 (product names; prepared by Sartomer Japan Inc.); and EBECRYL204, EBECRYL205, EBECRYL264, EBECRYL265, EBECRYL294/25HD, EBECRYL1259, EBECRYL4820, EBECRYL8465, EBECRYL9260, KRM8296, EBECRYL8311, EBECRYL8701, KRM8667, and EBECRYL8201 (product names; prepared by Daicel-allnex Ltd.) can be used for the compounding.

The (M) component may be used alone, or two or more types thereof may be used in combination.

Among them, as the (M) component, a polyfunctional monomer is preferable, among them, a compound represented by general formula (m-1) and urethane (meth)acrylate are further preferable from the viewpoint that polymerization easily proceeds.

Among the compounds represented by general formula (m-1), it is particularly preferable to contain a caprolactone-modified (meth)acrylate monomer. ε-caprolactone-modified tris-(2-acryloxyethyl) isocyanurate is particularly preferable.

With respect to the urethane (meth)acrylate, a urethane (meth)acrylate having three functional groupsis preferable, and a compound represented by general formula (m-2) is particularly preferable.

In the composition for forming an interlayer insulating film, the content of the (M) component is preferably 30% by mass or more, more preferably 30 to 70% by mass, and further preferably 40 to 60% by mass, with respect to the total content (100% by mass) of the (M) component and the imide compound (Z).

When the content of the (M) component is equal to or greater than the lower limit of the above-described preferred range, the mechanical properties of the interlayer insulating film are further improved. When the content of the (M) component is equal to or lower than the upper limit of the above-described preferred range, the lithography properties (sensitivity and the like) are easily improved.

Imide Compound (Z)

An imide compound (Z) (hereinafter, also referred to as "(Z) component") to be contained in the composition for forming an interlayer insulating film of the embodiment is a compound represented by the following general formula (z-1).

[Chemical Formula 8.]

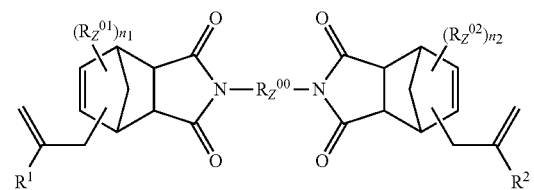

(z-1)

In the formula, $R^1$ and $R^2$ each independently represent a hydrogen atom or an alkyl group having 1 to 5 carbon atoms, $R_z^{00}$ represents a divalent organic group containing a linear, branched, or cyclic aliphatic hydrocarbon group, and/or an aromatic hydrocarbon group, $R_z^{01}$ and $R_z^{02}$ each independently represent an alkyl group having 1 to 5 carbon atoms or an alkoxy group having 1 to 5 carbon atoms, and $n_1$ and $n_2$ each independently represent 0 or 1.

In the formula (z-1), $R^1$ and $R^2$ each independently represent a hydrogen atom or an alkyl group having 1 to 5 carbon atoms. As the alkyl group having 1 to 5 carbon atoms, a linear or branched alkyl group having 1 to 5 carbon atoms is preferable, and specifically, examples thereof include a methyl group, an ethyl group, a propyl group, an isopropyl group, an n-butyl group, an isobutyl group, a tert-butyl group, a pentyl group, an isopentyl group, and a neopentyl group. The methyl group and the ethyl group are preferable, and the methyl group is further preferable.

In the above-described formula (z-1), $R_z^{00}$ represents a divalent organic group containing a linear, branched, or cyclic aliphatic hydrocarbon group and/or an aromatic hydrocarbon group.

The aliphatic hydrocarbon group in $R_z^{00}$ may be saturated or unsaturated, and is preferably saturated.

The number of carbon atoms of the linear aliphatic hydrocarbon group in $R_z^{00}$ is preferably 1 to 10, more preferably 1 to 6, further preferably 1 to 4, and most preferably 1 to 3.

As the linear aliphatic hydrocarbon group, a linear alkylene group is preferable. Specifically, examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The number of carbon atoms of the branched aliphatic hydrocarbon group in $R_z^{00}$ is preferably 2 to 10, more preferably 3 to 6, further preferably 3 or 4, and most preferably 3.

As the branched aliphatic hydrocarbon group, a branched alkylene group is preferable. Specifically, examples thereof include an alkyl alkylene group such as an alkyl methylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an alkyl ethylene group such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; an alkyl trimethylene group such as —$CH(CH_3)CH_2CH_2$— and —$CH_2CH(CH_3)CH_2$—; and an alkyl tetramethylene group such as —$CH(CH_3)CH_2CH_2CH_2$— and —$CH_2CH(CH_3)CH_2CH_2$—. The alkyl group in the alkyl alkylene group is preferably a linear alkyl group having 1 to 5 carbon atoms.

The linear or branched aliphatic hydrocarbon group in $R_z^{00}$ may or may not have a substituent. Examples of the substituent include a fluorine atom, a fluorinated alkyl group having 1 to 5 carbon atoms which is substituted with a fluorine atom, and a carbonyl group.

Examples of the cyclic aliphatic hydrocarbon group in $R_z^{00}$ include an alicyclic hydrocarbon group (a group obtained by removing two hydrogen atoms from an aliphatic hydrocarbon ring), a group in which the alicyclic hydrocarbon group is bonded to a terminal of the linear or branched aliphatic hydrocarbon group, and a group in which the alicyclic hydrocarbon group is present in the middle of the linear or branched aliphatic hydrocarbon group. Examples of the linear or branched aliphatic hydrocarbon group include the same group as the linear or branched aliphatic hydrocarbon group.

The number of carbon atoms of the alicyclic hydrocarbon group is preferably 3 to 20, and more preferably 3 to 12.

The alicyclic hydrocarbon group may be polycyclic, or monocyclic. As a monocyclic alicyclic hydrocarbon group, a group obtained by removing two hydrogen atoms from a monocycloalkane is preferable. The number of carbon atoms of the monocycloalkane is preferably 3 to 6. Specifically, examples thereof include cyclopentane and cyclohexane. As a polycyclic alicyclic hydrocarbon group, a group obtained by removing two hydrogen atoms from polycycloalkane is preferable, and the number of carbon atoms of polycycloalkane is preferably 7 to 12. Specifically, examples thereof include adamantane, norbornane, isobornane, tricyclodecane, and tetracyclododecane.

The cyclic aliphatic hydrocarbon group in $R_z^{00}$ may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and is most preferably a methyl group, an ethyl group, a propyl group, an n-butyl group, and a tert-butyl group.

The alkoxy group as the substituent is preferably an alkoxy group having 1 to 5 carbon atoms, more preferably a methoxy group, an ethoxy group, an n-propoxy group, an iso-propoxy group, an n-butoxy group, and a tert-butyl group, and most preferably a methoxy group and an ethoxy group.

Examples of the halogen atom as the substituent include a fluorine atom, a chlorine atom, a bromine atom, and an iodine atom, and the fluorine atom is preferable.

Examples of the halogenated alkyl group as the substituent include a group obtained by substituting a portion or all of the hydrogen atoms of the alkyl group with a halogen atom.

In the cyclic aliphatic hydrocarbon group, some of the carbon atoms for constituting the ring structure may be substituted with a substituent which contains a heteroatom. The substituent containing the heteroatom is preferably —O—, —C(=O)—O—, —S—, —S(=O)$_2$—, or —S(=O)$_2$—O—.

The aromatic hydrocarbon group in $R_z^{00}$ is a hydrocarbon group having an aromatic ring.

The number of the carbon atoms of the aromatic hydrocarbon group is preferably 3 to 30, further preferably 5 to 30, still further preferably 5 to 20, particularly preferably 6 to 15, and most preferably 6 to 10. In this regard, the number of the carbon atoms does not include the number of the carbon atoms of the substituent.

Specifically, examples of the aromatic ring contained in the aromatic hydrocarbon group include an aromatic hydrocarbon ring such as benzene, biphenyl, fluorene, naphthalene, anthracene, and phenanthrene; and aromatic heterocycle in which a portion of carbon atoms constituting the aromatic hydrocarbon ring is substituted with a heteroatom. Examples of the heteroatom in the aromatic heterocycle include an oxygen atom, a sulfur atom, and a nitrogen atom.

Specifically, examples of the aromatic hydrocarbon group include a group (an arylene group) obtained by removing two hydrogen atoms from the aromatic hydrocarbon ring; and a group (for example, a group obtained by removing one hydrogen atom from an aryl group in an aryl alkyl group such as a benzyl group, a phenethyl group, a 1-naphtyl methyl group, a 2-naphtyl methyl group, a 1-naphtyl ethyl group, and a 2-naphtyl ethyl group) obtained by substituting one hydrogen atom of a group (an aryl group) obtained by removing one hydrogen atom from the aromatic hydrocarbon ring with an alkylene group. The number of carbon atoms of the alkylene group (the alkyl chain in the aryl alkyl group) is preferably 1 to 4, is further preferably 1 to 2, and is particularly preferably 1.

With respect to the aromatic hydrocarbon group, the hydrogen atom contained in the aromatic hydrocarbon group may be substituted with a substituent. For example, a hydrogen atom bonded to the aromatic ring in the aromatic hydrocarbon group may be substituted with a substituent. Examples of the substituent include an alkyl group, an alkoxy group, a halogen atom, a halogenated alkyl group, and a hydroxyl group.

The alkyl group as the substituent is preferably an alkyl group having 1 to 5 carbon atoms, and is most preferably a methyl group, an ethyl group, a propyl group, an n-butyl group, and a tert-butyl group.

Examples of an alkoxy group, a halogen atom, and a halogenated alkyl group as the substituent include those exemplified as a substituent which substitutes a hydrogen atom contained in the cyclic aliphatic hydrocarbon group.

The organic group in $R_z^{00}$ may have a divalent linking group containing a heteroatom.

Preferred examples of the divalent linking group containing a heteroatom include —O—, —C(=O)—O—, —C(=O)—, —O—C(=O)—O—, —C(=O)—NH—, —NH—, —NH—C(=NH)— (H may be substituted with a substituent such as an alkyl group and an acyl group), —S—, —S(=O)$_2$—, —S(=O)$_2$—O—, and a group represented by general formulae —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m''}$—Y$^{22}$—, —Y$^{21}$—O—C(=O)—Y$^{22}$— and —Y$^{21}$—S(=O)$_2$—O—Y$^{22}$— [ in the formulae, Y$^{21}$ and Y$^{22}$ each independently represent a divalent hydrocarbon group which may have a substituent, O represents an oxygen atom, and m'' represents an integer of 0 to 3].

In a case where the divalent linking group containing the heteroatom is —C(=O)—NH—, —C(=O)—NH—C(=O)—, —NH—, or —NH—C(=NH)—, H may be substituted with a substituent such as an alkyl group and an acyl group. The substituent (an alkyl group, an acyl group, or the like) preferably has 1 to 10 carbon atoms, further preferably has 1 to 8 carbon atoms, and particularly preferably has 1 to 5 carbon atoms.

In general formulae —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$—, and —Y$^{21}$—S(=O)$_2$—O—Y$^{22}$—, Y$^{21}$ and Y$^{22}$ each independently represent a divalent hydrocarbon group which may have a substituent. Examples of the divalent hydrocarbon group include a linear, branched, or cyclic aliphatic hydrocarbon group and an aromatic hydrocarbon group exemplified for $R_z^{00}$.

Y$^{21}$ is preferably a linear aliphatic hydrocarbon group, more preferably a linear alkylene group, further preferably a linear alkylene group having 1 to 5 carbon atoms, and particularly preferably a methylene group or an ethylene group.

Y$^{22}$ is preferably a linear or branched aliphatic hydrocarbon group, and more preferably a methylene group, an ethylene group, or an alkyl methylene group. An alkyl group in the alkyl methylene group is preferably a linear alkyl group having 1 to 5 carbon atoms, is more preferably a linear alkyl group having 1 to 3 carbon atoms, and most preferably a methyl group.

In the group represented by general formula —[Y$^{21}$—C(=O)—O]$_{m''}$—Y$^{22}$—, m'' is an integer of 0 to 3, is preferably an integer of 0 to 2, more preferably 0 or 1, and is particularly preferably 1. That is, as a group represented by general formula —[Y$^{21}$—C(=O)—O]$_{m''}$—Y$^{22}$—, a group represented by general formula —Y$^{21}$—C(=O)—O—Y$^{22}$— is particularly preferable. Among them, a group represented by general formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, further preferably 1 or 2, and most preferably 1. b' is an integer of 1 to 10, is preferably an integer of 1 to 8, is further preferably an integer of 1 to 5, is still further preferably 1 or 2, and is most preferably 1.

$R_z^{00}$ is preferably a linear or branched alkylene group or fluorinated alkyl group, an aromatic hydrocarbon group, a combination of the linear or branched alkylene group or fluorinated alkyl group with the aromatic hydrocarbon group, or a combination of one or more selected from the group consisting of the linear or branched alkylene group or fluorinated alkyl group, the aromatic hydrocarbon group, and one or more selected from the group consisting of —O—, —C(=O)—NH—, —S—, and —S(=O)$_2$—.

Preferred examples of $R_z^{00}$ are shown below. The symbol of "★" in the formulae represents a bond which is bonded to the nitrogen atom (N) in the formula (z-1).

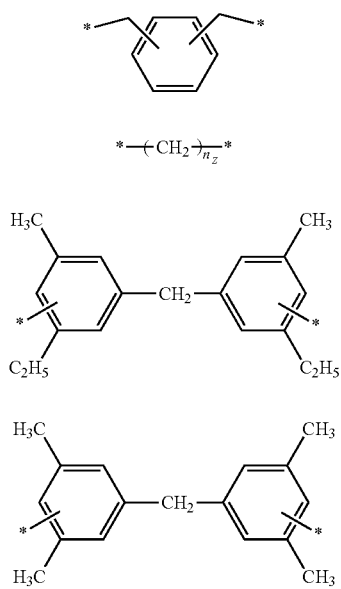

[In the formula ($R_z^{00}$-38), $n_z$ is an integer of 1 to 10]

In the above-described examples, as $R_z^{00}$, a divalent organic group represented by formula ($R_z^{00}$-4), formula ($R_z^{00}$-37), or formula ($R_z^{00}$-38) is preferable in terms of the fracture elongation, the solubility in solvents, and the like.

In the above-described formula (z-1), $R_z^{01}$ and $R_z^{02}$ each independently represent an alkyl group having 1 to 5 carbon atoms or an alkoxy group having 1 to 5 carbon atoms. As an alkyl group having 1 to 5 carbon atoms, a linear or branched alkyl group having 1 to 5 carbon atoms is preferable. Specifically, examples thereof include a methyl group, an ethyl group, a propyl group, an isopropyl group, an n-butyl group, an isobutyl group, a tert-butyl group, a pentyl group, an isopentyl group, and a neopentyl group. Among them, the methyl group and the ethyl group are preferable, and the methyl group is more preferable. The alkoxy group having 1 to 5 carbon atoms is preferably a methoxy group, an ethoxy group, an n-propoxy group, an iso-propoxy group, an n-butoxy group, and a tert-butoxy group, and is more preferably a methoxy group and an ethoxy group.

In the formula (z-1), $n_1$ and $n_2$ each independently represent 0 or 1, and is preferably 0.

Preferred examples of the (Z) component are shown below.

[Chemical Formula 13.]

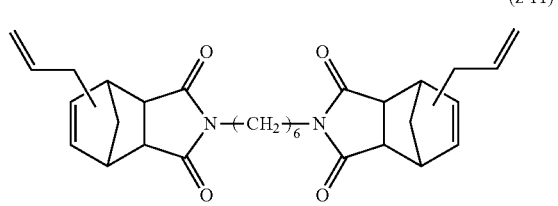

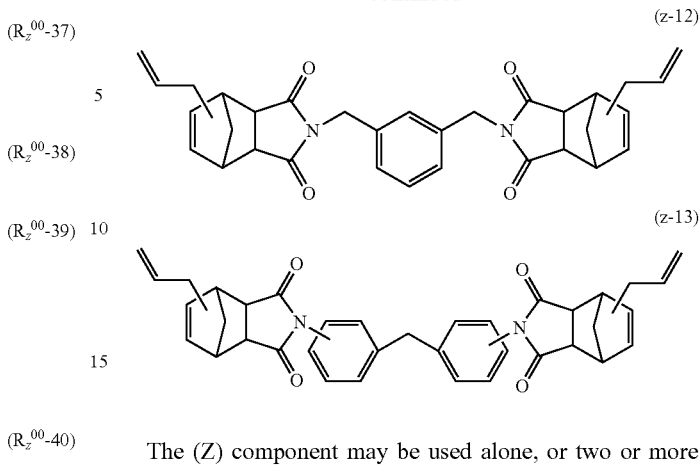

The (Z) component may be used alone, or two or more types thereof may be used in combination.

Among them, from the viewpoint that the effect of the present invention can be more easily obtained, the (Z) component is preferably a compound represented by the above chemical formula (z-11), a compound represented by the above chemical formula (z-12), and a compound represented by the above chemical formula (z-13). Among them, the compound represented by the chemical formula (z-11) and the compound represented by the chemical formula (z-12) are further preferable, and the compound represented by the chemical formula (z-12) is particularly preferable.

In the composition for forming an interlayer insulating film, the content of the (Z) component is preferably 20 to 80% by mass, more preferably 25 to 75% by mass, and further preferably 30 to 70% by mass, with respect to the total content (100% by mass) of the (M) component and the (Z) component.

When the content of the (Z) component is equal to or greater than the lower limit of the above-described preferred range, the fracture elongation of the polymerized product of the composition becomes easy to be further improved, and when the content of the (Z) component is equal to or lower than the upper limit of the above-described preferred range, it is easy to achieve both of the fracture elongation and tensile strength of the polymerized product.

In a case of containing an alkali-soluble elastomer (P) described below, the content of the (Z) component is preferably 5 to 50% by mass, more preferably 15 to 45% by mass, and further preferably 20 to 40% by mass, with respect to the total content (100% by mass) of the (M) component, the (P) component, and the (Z) component in the composition for forming an interlayer insulating film.

When the content of the (Z) component is equal to or greater than the lower limit of the above-described preferred range, the fracture elongation of the polymer of the composition becomes easy to be further improved, and when the content of the (Z) component is equal to or lower than the upper limit of the above-described preferred range, it is easy to achieve both of the fracture elongation and tensile strength of the polymerized product.

Reaction Promoter (A)

The composition for forming an interlayer insulating film of the embodiment contains a reaction promoter (hereinafter, also referred to as "(A)" component) together with the (M) component and the (Z) component.

Here, the reaction promoter means a component that functions such that polymerization proceeds faster.

Examples of the (A) component include a compound containing boron, Lewis acids other than those containing boron, and other compounds.

Examples of the compound containing boron include borane and boroxine.

Examples of borane include triphenyl borane, trimethyl phenyl borane, triparafluoro phenyl borane, trimethoxy phenyl borane, trimethafluoro phenyl borane, trifluoro borane, and tris(pentafluorophenyl) borane. Among them, triphenyl borane and tris(pentafluorophenyl) borane are preferable.

Examples of boroxine include triphenyl boroxine, trimethyl phenyl boroxine, and 2,4,6-tris(3,4,5-trifluoro phenyl) boroxine. Among them, 2,4,6-tris(3,4,5-trifluoro phenyl) boroxine is preferable.

Examples of the Lewis acid include compounds being Lewis acid among the above compounds containing boron, and most of metal ions such as $Al^{3+}$, $Ni^{2+}$ and $Sc^{3+}$. Among them, $Sc^{3+}$ are preferable. Examples of compounds which provide Lewis acid include a salt of Lewis acid and sulfonic acid. Among them, a salt of Lewis acid and perfluoroalkyl sulfonic acid is preferable. Preferable examples thereof include trifluoromethanesulfonic acid Scandium, and the like.

Examples of the above-described other compounds in the (A) component include a complex of phosphine and Lewis acid in which phosphine is coordinated to Lewis acid.

The complex of phosphine and Lewis acid is preferably a complex of phosphine and borane, and is particularly preferably a complex of triphenyl phosphine and triphenyl borane.

The reaction promoter may be used alone, or two or more types thereof may be used in combination.

Among them, as the reaction promoter, from the viewpoint that polymerization easily proceeds, the complex containing Lewis acid is preferable, and the complex of phosphine and Lewis acid is particularly preferable.

In the composition for forming an interlayer insulating film, the content of the reaction promoter is preferably 0.1 to 10 parts by mass, more preferably 0.1 to 5 parts by mass, and further preferably 0.1 to 2 parts by mass, with respect to the total content of 100 parts by mass of the (M) component and the (Z) component.

When the content of the reaction promoter is equal to or greater than the lower limit of the above-described preferred range, it is possible to sufficiently obtain the effect of compounding the reaction promoter, and when the content of the reaction promoter is equal to or lower than the upper limit of the above-described preferred range, it is possible to sufficiently obtain the effect of compounding the reaction promoter.

Polymerization Initiator

A polymerization initiator to be contained in the composition for forming an interlayer insulating film of the embodiment is not limited as long as it can initiate the polymerization of the (M) component and the (Z) component at least, and it is possible to use known polymerization initiators (a photopolymerization initiator, a thermal polymerization initiator, and the like) in the related art.

Examples of such a polymerization initiator include benzophenone; N,N'-tetraalkyl-4,4'-diaminobenzophenone such as N,N'-tetramethyl-4,4'-diaminobenzophenone (Michler's ketone); aromatic ketones such as 2-benzyl-2-dimethylamino-1-(4-morpholinophenyl)-butanone-1,2-methyl-1-[4-(methylthio) phenyl]-2-morpholino-propanone-1; quinones such as alkyl anthraquinone; a benzoin ether compound such as benzoin alkyl ethers; a benzoin compound such as benzoin and alkylbenzoin; a benzyl compound such as benzyl dimethyl ketal; 2,4,5-triaryl imidazole dimer such as 2-(o-chlorophenyl)-4,5-diphenyl imidazole dimer, 2-(o-chlorophenyl)-4,5-di(methoxy phenyl) imidazole dimer, 2-(o-fluorophenyl)-4,5-diphenyl imidazole dimer, 2-(o-methoxyphenyl)-4,5-diphenyl imidazole dimer, and 2-(p-methoxyphenyl)-4,5-diphenyl imidazole dimer; an acridine compound such as 9-phenyl acridine and 1,7-bis(9,9'-acridinyl) heptane; N-phenylglycine and an N-phenylglycine derivative; and a coumarin compound.

As the polymerization initiator, it is possible to use commercially available products such as IRGACURE 907, IRGACURE 369, IRGACURE 369E, and IRGACURE 379EG (which are prepared by BASF).

The polymerization initiator may be used alone, or two or more types thereof may be used in combination.

Among them, as the polymerization initiator, from the viewpoint that polymerization easily proceeds, aromatic ketone is preferably used, and 2-benzyl-2-dimethylamino-1-(4-morpholinophenyl)-butanone-1 (IRGACURE 369) and 2-methyl-1-(4-methylthiophenyl)-2-morpholinopropan-1-one (IRGACURE 907) are further preferably used.

In the composition for forming an interlayer insulating film, the content of the polymerization initiator is preferably 0.1 to 10 parts by mass, more preferably 0.3 to 5 parts by mass, and further preferably 0.5 to 3 parts by mass, with respect to the total content of 100 parts by mass of the (M) component and the (Z) component.

When the content of the polymerization initiator is equal to or greater than the lower limit or is equal to or lower than the upper limit of the above-described preferred range, the polymerization easily sufficiently proceeds.

Optional Components

The composition for forming an interlayer insulating film of the embodiment may contain other components (optional components) in addition to the polymerizable monomer (M), the imide compound (Z), the reaction promoter (A), and the polymerization initiator.

Examples of the optional components include various additives such as an elastomer, a silane coupling agent, a surfactant, a thermal acid generating agent, a crosslinking agent, an organic solvent, a photosensitive component, a sensitizer, and an antifoaming agent.

Elastomer

The composition for forming an interlayer insulating film of the embodiment preferably further contains an elastomer. When the elastomer is contained, the fracture elongation of the polymerized product of the composition becomes easy to be further improved.

In the embodiment, preferred examples of the elastomer include an alkali-soluble elastomer (hereinafter, also referred to as "(P) component") containing a polymerizable group.

Examples of the polymerizable group in the (P) component include an unsaturated double bond functional group such as a vinyl group, an allyl group, an acryloyl group, and a methacryloyl group; and an unsaturated triple bond functional group such as a propargyl group. Among them, a vinyl group, an acryloyl group, and a methacryloyl group are preferable from the viewpoint that polymerization easily proceeds.

In addition, the (P) component has an alkali-soluble group as well as the polymerizable group. Since the (P) component has the alkali-soluble group, a negative type insulating film can be easily formed by alkali developing.

Examples of the alkali-soluble group include a hydroxyl group, a carboxy group, and a sulfonamide group.

The preferred (P) component is appropriately selected in accordance with required properties and the applications thereof, and examples thereof include a photo curable elastomer and a heat curable elastomer.

Specifically, examples of the (P) component include a polymer compound having a (meth)acrylic unit.

In addition, preferable examples of the (P) component include a polymer (P1) (hereinafter, also referred to as "(P1) component") having a urethane bond as a main chain. Since the urethane bond is contained as a main chain, rubbery elasticity is easily exhibited, so that the fracture elongation is further improved while maintaining the tensile strength (film strength).

Among them, in terms of the film forming properties (ease of polymerization with the (M) component), the physical properties of the film (tensile strength and fracture elongation), and the solubility in an alkali developing solution, the (P1) component is preferably a polymer containing a urethane bond as a main chain and a (meth)acryloyl group and a carboxy group as a side chain. Preferable examples thereof include ACRIT PH-9001 and PH-9002 (prepared by Taisei Fine Chemical Co., Ltd).

The mass average molecular weight of the (P) component is preferably in a range of 10,000 to 100,000.

Note that, the mass average molecular weight of the (P) component is a value based on the standard polystyrene which is measured by a gel permeation chromatography (GPC) method.

The (P) component may be used alone, or two or more types thereof may be used in combination.

In a case where the composition for forming an interlayer insulating film contains the (P) component, in the composition for forming an interlayer insulating film, the content of the (P) component is preferably 5 to 60% by mass, more preferably 10 to 50% by mass, and further preferably 20 to 40% by mass, with respect to the total content (100% by mass) of the (M) component, the (P) component, and the (Z) component.

When the content of the (P) component is equal to or greater than the lower limit of the above-described preferred range, the fracture elongation becomes easy to be further improved while maintaining the tensile strength (film strength) of the polymerized product of the composition, and when the content of the (P) component is equal to or lower than the upper limit of the above-described preferred range, it is easy to achieve both of the fracture elongation and tensile strength of the polymerized product.

Silane Coupling Agent

The composition for forming an interlayer insulating film of the embodiment may further contain a silane coupling agent (hereinafter, also referred to as "(C) component"). In a case where the composition for forming an interlayer insulating film contains the (C) component, it is possible to further improve the adhesiveness between a film formed by the composition for forming an interlayer insulating film and a substrate, and it is possible to adjust the properties of the film formed by the composition for forming an interlayer insulating film.

Specific examples of the (C) component include γ-aminopropyl trimethoxy silane, γ-aminopropyl triethoxy silane, γ-glycidoxypropyl trialkoxy silane, γ-glycidoxypropyl alkyl dialkoxysilane, γ-methacryloxypropyl trialkoxy silane, γ-methacryloxypropyl alkyl dialkoxy silane, γ-chloropropyl trialkoxy silane, γ-mercaptopropyl trialkoxy silane, β-(3,4-epoxycyclohexyl)ethyl trialkoxy silane, and vinyl trialkoxy silane. Among them, γ-glycidoxypropyl trialkoxy silane and γ-methacryloxypropyl trialkoxy silane are preferable.

The (C) component may be used alone, or two or more types thereof may be used in combination.

In the composition for forming an interlayer insulating film, the content of the (C) component is preferably 0.1 to 10 parts by mass, more preferably 0.5 to 5 parts by mass, and further preferably 0.5 to 2 parts by mass, with respect to the total content of 100 parts by mass of the (M) component and the (Z) component.

In addition, in a case where the composition for forming an interlayer insulating film contains the (C) component, in the composition for forming an interlayer insulating film, the content of the (C) component is preferably 0.01 to 10% by mass, more preferably 0.1 to 2% by mass, and further preferably 0.2 to 1.5% by mass, with respect to the total solid content (100% by mass) of the composition for forming an interlayer insulating film.

When the content of the (C) component is within the preferred range, the adhesiveness between the pattern formed of the composition for forming an interlayer insulating film and the substrate is preferably improved.

Surfactant

The composition for forming an interlayer insulating film of the embodiment may contain a surfactant. When the surfactant is contained, it is possible to improve coating properties and flatness.

As the surfactant, surfactants known in the related art may be used, and examples thereof include an anionic compound, a cationic compound, and a nonionic compound.

Examples of the surfactant include a silicon-based surfactant and a fluorine-based surfactant. Specifically, examples of the silicon-based surfactant include BYK-077, BYK-085, BYK-300, BYK-301, BYK-302, BYK-306, BYK-307, BYK-310, BYK-320, BYK-322, BYK-323, BYK-325, BYK-330, BYK-331, BYK-333, BYK-335, BYK-341, BYK-344, BYK-345, BYK-346, BYK-348, BYK-354, BYK-355, BYK-356, BYK-358, BYK-361, BYK-370, BYK-371, BYK-375, BYK-380, and BYK-390 which are manufactured by BYK-Chemie.

Examples of the fluorine-based surfactant include F-114, F-177, F-410, F-411, F-450, F-493, F-494, F-443, F-444, F-445, F-446, F-470, F-471, F-472SF, F-474, F-475, F-477, F-478, F-479, F-480SF, F-482, F-483, F-484, F-486, F-487, F-172D, MCF-350SF, TF-1025SF, TF-1117SF, TF-1026SF, TF-1128, TF-1127, TF-1129, TF-1126, TF-1130, TF-1116SF, TF-1131, TF-1132, TF-1027SF, TF-1441, and TF-1442, which are manufactured by DIC (DaiNippon Ink & Chemicals) Corporation.

Examples of the other surfactants include X-70-090 (product name, prepared by Shin-Etsu Chemical Co., Ltd).

The surfactant can be used alone or two or more types thereof can be used in combination.

In the composition for forming an interlayer insulating film, the content of the surfactant is preferably 0.05 to 0.5 parts by mass, is more preferably 0.05 to 0.3 parts by mass, and is further preferably 0.05 to 0.2 parts by mass, with respect to the total content of 100 parts by mass of the (M) component and the (Z) component.

In addition, in a case where the composition for forming an interlayer insulating film contains the surfactant, in the composition for forming an interlayer insulating film, the content of the surfactant is preferably 0.01 to 10% by mass, is more preferably 0.05 to 2% by mass, and is further preferably 0.1 to 1.5% by mass, with respect to the total solid content (100% by mass) of the composition for forming an interlayer insulating film.

When the content of the surfactant is within the above-described preferred range, the adhesiveness between the pattern formed of the composition for forming an interlayer insulating film and the substrate is preferably improved.

Organic Solvent

The composition for forming an interlayer insulating film of the embodiment preferably contains an organic solvent (hereinafter, also referred to as "(S) component") so as to improve the coating properties and to adjust the viscosity.

Examples of the (S) component include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, and dipropylene glycol; derivatives of polyhydric alcohols such as a compound having an ester bond (such as ethylene glycol monoacetate, diethylene glycol monoacetate, propylene glycol monoacetate, or dipropylene glycol monoacetate), and a compound having an ether bond (such as monoalkyl ether (e.g., monomethyl ether, monoethyl ether, monopropyl ether and monobutyl ether) or monophenyl ether) of the polyhydric alcohol or the compound having the ester bond [among them, propylene glycol monomethyl ether acetate (PGMEA), propylene glycol monomethyl ether (PGME), 3-methoxybutyl acetate (MA), and 3-methoxybutanol (BM) are preferable]; cyclic ethers such as dioxane, esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethyl benzyl ether, cresyl methyl ether, diphenyl ether, dibenzyl ether, phenetole, butyl phenyl ether, ethyl benzene, diethyl benzene, pentyl benzene, isopropyl benzene, toluene, xylene, cymene, and mesitylene; and dimethyl sulfoxide (DMSO).

The (S) component may be used alone or may be used as a mixed solvent of two or more types thereof.

Among them, the (S) component is preferably PGME, PGMEA, MA, a mixed solvent of the PGME and the PGMEA, or a mixed solvent of the MA and the BM.

The amount of the (S) component used is not particularly limited; however, it is properly set to provide a concentration with which coating on the substrate can be performed depending on the thickness of a film to be coated. Specifically, the concentration of solid contents of the composition for forming an interlayer insulating film is preferably 10 to 50% by mass, and is particularly preferably 15 to 40% by mass.

Photosensitive Component

Examples of the photosensitive component include a quinonediazide esterified product such as an esterified product of a phenol compound and a 1,2-naphthoquinonediazide-5 (or 4)-sulfonyl compound, and preferred examples thereof include a quinone diazide esterified product prepared by esterifying bis(2-methyl-4-hydroxy-5-cyclohexyl phenyl)-3,4-dihydroxyphenyl methane with a 1,2-naphthoquinone diazide-5-sulfonyl compound, and a quinone diazide esterified product prepared by esterifying 2,3,4,4'-tetrahydroxybenzophenone with a 1,2-naphthoquinone diazide-5-sulfonyl compound.

Sensitizer and Antifoaming Agent

As the sensitizer, known sensitizers used for resist and the like in the related art can be used. Examples of the sensitizer include a compound having a phenolic hydroxyl group and a molecular weight of 1,000 or less.

As the antifoaming agent, known antifoaming agents in the related art can be used. Examples thereof include a silicon-based compound and a fluorine-based compound.

The composition for forming an interlayer insulating film of the embodiment can be prepared, for exsmple, by mixing the (M) component, the (Z) component, the (A) component, the polymerization initiator, and optional components, and then filtrating the mixture by a filter as necessary.

As described above, the composition for forming an interlayer insulating film of the embodiment contains a reaction promoter (A) together with a polymerizable monomer (M), the imide compound (Z) represented by general formula (z-1), and the polymerization initiator.

In the embodiment, since the composition for forming an interlayer insulating film contains the (A) component, the polymerization of the (M) component and the (Z) component more easily proceeds. With this, the mechanical properties of the interlayer insulating film are more improved.

In addition, a curing temperature at the time of forming the interlayer insulating film can be decreased, and thus it is possible to prevent an adverse effect on a device or the like.

Typically, in the interlayer insulating film, it has been known that the film strength and the fracture elongation are in a trade-off relationship. However, according to the composition for forming an interlayer insulating film of the embodiment, it is possible to form an interlayer insulating film having further improved the mechanical properties, for example, an interlayer insulating film having further improved fracture elongation, by containing the (A) component together with the (M) component, the (Z) component, and the polymerization initiator as described above.

Interlayer Insulating Film

The embodiment according to the second aspect of the present invention relates to an interlayer insulating film containing a polymerized product of the composition for forming an interlayer insulating film of the embodiment according to the first aspect.

The interlayer insulating film of the embodiment is formed, for example, according to a method for forming an interlayer insulating film pattern, which will be described below. The interlayer insulating film of the embodiment has improved mechanical properties, especially fracture elongation.

Note that, mechanical properties (tensile strength, fracture elongation, and tensile modulus of elasticity) of the interlayer insulating film are measured, for example, by using a texture analyzer (product name: EZ Test, manufactured by Shimadzu Corporation) and a universal testing machine (product name: TENSILON, manufactured by ORIENTEC Co., Ltd).

The interlayer insulating film of the embodiment can be suitably used as an interlayer insulating film provided for insulating the wires disposed in layers in electronic parts such as a liquid crystal display element, an integrated circuit element, and a solid state imaging element.

Method for Forming an Interlayer Insulating Film Pattern

The embodiment according to the third aspect of the present invention relates to a method for forming an interlayer insulating film pattern including a step (i) of applying the composition for forming an interlayer insulating film of the embodiment according to the first aspect on a support to form a coated film; a step (ii) of exposing the coated film; a step (iii) alkali developing the coated film after the exposing to form a pre-pattern; and a step (iv) of curing the pre-pattern with heat to obtain an interlayer insulating film pattern.

The method for forming an interlayer insulating film pattern according to the embodiment can be performed as follows, for example.

Step (i)

In the step (i), first, a support such as a substrate is coated with the above-described composition for forming an interlayer insulating film of the embodiment according to the first aspect by using a spinner, a spin coater, a roll coater, a spray coater, a slit coater, or the like, and then is dried so as to form a coated film.

Examples of the substrate include a glass substrate which is provided with a wire such as a transparent conductive circuit, and is provided with a black matrix, a color filter, and a polarizing plate, as necessary.

Examples of the method for drying include a method of drying with a hot plate at a temperature of 80 to 120° C. for 120 to 500 seconds.

The film thickness of the coated film is not particularly limited, and is preferably 1 to 100 μm.

Step (ii)

In the step (ii), the coated film formed in the step (i) is exposed.

The exposure of the coated film is performed by irradiating the coated film with active energy rays such as ultraviolet rays and excimer laser light. Examples of light sources of the active energy rays include a low-pressure vapor mercury lamp, a high-pressure mercury vapor lamp, an ultrahigh-pressure mercury vapor lamp, a chemical lamp, and an excimer laser generator.

The amount of energy rays to be used for irradiation is different depending on compositions of the composition for forming an interlayer insulating film, but may be 30 to 2,000 mJ/cm², for example.

Step (iii)

In the step (iii), the coated film after the exposure in the step (ii) is subjected to the alkali developing so as to form a pre-pattern.

Examples of a developing solution used for the alkali developing include an organic alkaline aqueous solution such as a tetramethyl ammonium hydroxide (TMAH) aqueous solution or an aqueous solution of an inorganic alkali such as sodium hydroxide, potassium hydroxide, sodium metasilicate, and sodium phosphate.

Step (iv)

In the step (iv), the pre-pattern formed in the step (iii) is heated to be cured.

The pre-pattern is heated, for example, under the temperature condition of 300° C. or less, and is heated preferably at a temperature of 200 to 250° C. In the embodiment, the curing can be easily performed under the lower temperature conditions, and can be easily performed, preferably at a temperature of 220° C. or less.

Through the steps (i) to (iv), an interlayer insulating film patterned is formed in a desired range on a support.

Other Steps

The method for forming an interlayer insulating film pattern according to the embodiment may further include other steps, as necessary, besides the above-described steps (i) to (iv). For example, the method may include a step of performing a heating treatment (post exposure bake treatment) between the step (ii) and the step (iii).

Device

The embodiment according to the fourth aspect of the present invention relates to a device including a support having provided thereon the interlayer insulating film of the embodiment according to the second aspect.

The device of the embodiment is suitably used for electronic parts such as liquid crystal display elements, integrated circuit elements, solid-state imaging elements, and the like.

EXAMPLES

Hereinafter, the present invention will be more specifically described with reference to examples; however, the present invention is not limited to the following examples.

Examples 1 to 10 and Comparative Example 1

Preparation of Composition for Forming Interlayer Insulating Film

With respect to each working example, the components indicated in Tables 1 and 2 were mixed and the resulting mixture was dissolved in a mixed solvent composed of PGMEA and PGME in a mass ratio of PGMEA/PGME of 60/40 to prepare a composition for forming an interlayer insulating film.

Note that, the concentration of the solid contents of the composition for forming an interlayer insulating film was set to be 40% by mass in the respective examples.

TABLE 1

| | | Comparative Example | Examples | | | | | | |
|---|---|---|---|---|---|---|---|---|---|
| | | 1 | 1 | 2 | 3 | 4 | 5 | 6 | 7 |
| (M) component | (M)-1 | 50 | 50 | 50 | 50 | — | 35 | 35 | 25 |
| | (M)-2 | — | — | — | — | 50 | — | — | — |
| (Z) component | (Z)-1 | 50 | 50 | 50 | 50 | 50 | 30 | 30 | 50 |
| (A) component | (A)-1 | — | 1 | — | — | — | — | — | — |
| | (A)-2 | — | — | 1 | — | 1 | 0.5 | 0.5 | 0.5 |
| | (A)-3 | — | — | — | 1 | — | — | — | — |
| Polymerization initiator | (I)-1 | 1 | 1 | 1 | 1 | 1 | 1 | 1 | 1 |
| Optional components | (P)-1 | — | — | — | — | — | 35 | 35 | 25 |
| | (O)-1 | — | — | — | — | — | — | 5 | 5 |
| | (O)-2 | — | — | — | — | — | 1 | 1 | 1 |
| | (O)-3 | 0.1 | 0.1 | 0.1 | 0.1 | 0.1 | 0.1 | 0.1 | 0.1 |

TABLE 2

| | | Examples | | |
|---|---|---|---|---|
| | | 8 | 9 | 10 |
| (M) component | (M)-1 | 35 | 35 | 35 |
| | (M)-2 | — | — | — |
| (Z) component | (Z)-1 | 30 | 30 | — |
| | (Z)-2 | — | — | 30 |
| (A) component | (A)-1 | — | — | — |
| | (A)-2 | — | — | 0.5 |
| | (A)-3 | — | — | — |
| | (A)-4 | 1 | — | — |
| | (A)-5 | — | 1 | — |
| Polymerization initiator | (I)-1 | 1 | 1 | 1 |
| Optional components | (P)-1 | 35 | 35 | 35 |
| | (O)-1 | 5 | 5 | 5 |
| | (O)-2 | 1 | 1 | 1 |
| | (O)-3 | 0.1 | 0.1 | 0.1 |

The respective abbreviations in Tables 1 and 2 have the following meanings. In addition, the numerical value in the brackets is the compounding amount (parts by mass).

(M)-1: the following compound (M)-1, l+m+n≅3 in the chemical formula, "ARONIX M-327" (product name) prepared by Toagosei Co., Ltd.

[Chemical Formula 14.]

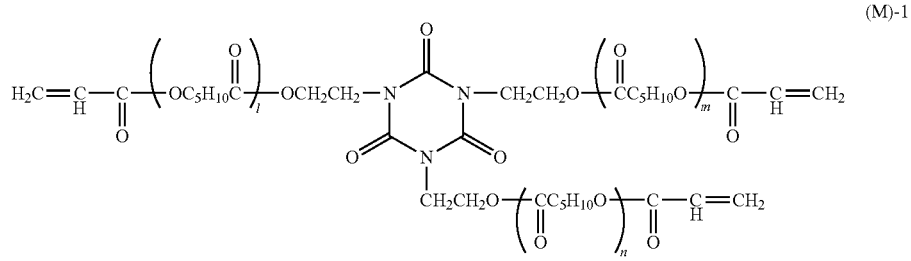

(M)-1

(M)-2: an aliphatic urethane acrylate compound (oligomer), "KRM 8296" (product name) prepared by Daicel-Allnex Ltd, urethane acrylate having three functional groups, fracture elongation of 42%, viscosity of 2,400 mPa·s at a temperature of 60° C., and glass transition temperature of cured product of −11° C.

(Z)-1: the following compound (Z)-1, bisallylnadiimide, "BANI-X" (product name) prepared by Maruzen Petrochemical.

[Chemical Formula 15.]

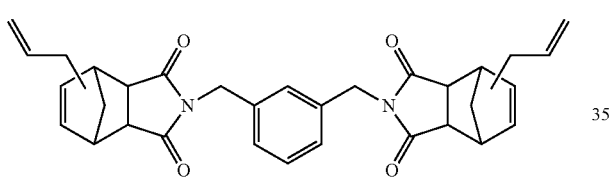

(Z)-1

(Z)-2: the following compound (Z)-2, bisallylnadiimide, "BANI-M" (product name) prepared by Maruzen Petrochemical.

[Chemical Formula 16.]

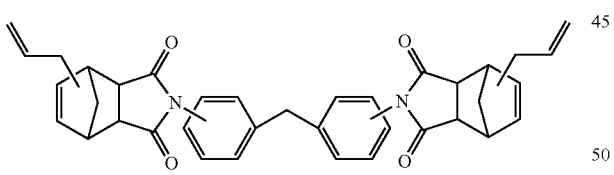

(Z)-2

(A)-1: triphenylborane
(A)-2: the following compound (A)-2, a complex of triphenylphosphine and triphenylborane, "TPP-S" (product name) prepared by Hokko Chemical Industry Co., Ltd.

[Chemical Formula 17.]

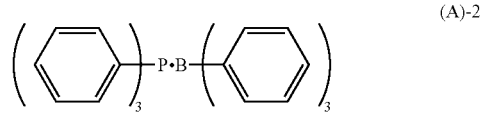

(A)-2

(A)-3: 2,4,6-tris(3,4,5-trifluorophenyl) boroxine
(A)-4: tris(pentafluorophenyl) borane
(A)-5: trifluoromethanesulfonic acid Scandium(III)

(I)-1: 2-benzyl-2-dimethylamino-1-(4-morpholinophenyl)-butanone-1, "IRGACURE 369E" (product name) prepared by BASF.

(P)-1: an alkali soluble UV curable urethane/acrylic polymer (urethane main chain type), "ACRIT PH-9001" (product name) prepared by Taisei Fine Chemical Co., Ltd; with a double bond equivalent of 890 g/mol, a mass average molecular weight of 20,000, and a viscosity of 900 mPa·s (O)-1: quinone diazide group-containing compound obtained by causing the following compound (O')-1 and 2 mol of naphthoquinonediazide-5-sulfonic acid ester to react with each other.

[Chemical Formula 18.]

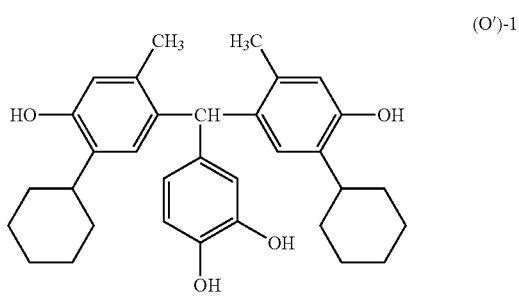

(O')-1

(O)-2: γ-methacryloxy propyl trimethoxy silane, "SILQUEST A-174 SILANE" (product name) prepared by Tanac Co., Ltd.
(O)-3: silicone surface conditioning agent, "BYK-310" (product name) prepared by BYK Chemie Japan.

Formation of Interlayer Insulating Film Pattern

Step (i):
With respect to each of Examples 1 to 10 and Comparative Example 1, a silicon substrate having a diameter of 8 inches was coated with the composition for forming an interlayer insulating film by a spin coater (TR25000: manufactured by Tokyo Ohka Kogyo Co., Ltd.), and was prebaked at 110° C. for 300 seconds so as to form a coated film having a film thickness of 10 μm.

Step (ii):
Next, the coated film was exposed (exposure amount of 500 mJ/cm²) by using ghi line stepper (manufactured by Ultratech, Inc.).

Step (iii):
Next, the coated film after exposure was subjected to alkali developing at 23° C. for 120 seconds by using 2.38% by mass of tetramethyl ammonium hydroxide (TMAH) aqueous solution "NMD-3" (product name, prepared by Tokyo Ohka Kogyo Co., Ltd.) so as to obtain a pre-pattern (in which a plurality of hole patterns having a diameter of 20 μm are formed).

Step (iv):

Next, the pre-pattern was subjected to the heating treatment (curing) under the curing conditions indicated in Table 2 so as to obtain a desired interlayer insulating film pattern.

An interlayer insulating film pattern was formed through the steps (i), (ii), (iii), and (iv).

Evaluation of Interlayer Insulating Film

The tensile strength, the fracture elongation, and the tensile modulus of elasticity of the prepared interlayer insulating film were measured by a universal testing machine (product name, TENSILON manufactured by ORIENTEC Co., Ltd).

The measurement result of the tensile strength which is denoted as "tensile strength (MPa)", the measurement result of the fracture elongation which is denoted as "elongation (%)", and the measurement result of the tensile modulus of elasticity which is denoted as "young modulus (GPa)" are indicated in Table 3.

TABLE 3

| | Curing conditions Heating temperature (° C.) Heating time (h) | Tensile strength Tensile strength (MPa) | Fracture elongation Elongation (%) | Tensile modulus of elasticity Young modulus (GPa) |
|---|---|---|---|---|
| Comparative Example 1 | 200° C., 2 h | 69 | 6.3 | 2.30 |
| | 220° C., 2 h | 83 | 24.8 | 2.02 |
| | 250° C., 2 h | 88 | 44.1 | 2.27 |
| Example 1 | 220° C., 2 h | 77 | 35.4 | 1.61 |
| Example 2 | 220° C., 2 h | 67 | 59.4 | 1.78 |
| Example 3 | 220° C., 2 h | 75 | 49.2 | 1.91 |
| Example 4 | 220° C., 2 h | 35 | 100 | 0.60 |
| Example 5 | 220° C., 2 h | 57.6 | 55.7 | 1.22 |
| Example 6 | 220° C., 2 h | 48.2 | 51.0 | 1.20 |
| Example 7 | 220° C., 2 h | 67.2 | 35.7 | 2.13 |
| Example 8 | 220° C., 2 h | 55 | 45 | 1.59 |
| Example 9 | 220° C., 2 h | 38 | 85 | 0.36 |
| Example 10 | 220° C., 2 h | 60 | 50 | 1.60 |

From the evaluation results indicated in Table 3, it is possible to confirm that the interlayer insulating film formed by using the composition for forming an interlayer insulating film in Examples 1 to 10 to which the present invention is applied has the improved fracture elongation at a heating temperature of 220° C., as compared with the interlayer insulating film formed by using the composition for forming an interlayer insulating film in Comparative Example 1.

In a case of using the composition for forming an interlayer insulating film in Comparative Example 1, it is necessary to set the heating temperature to be approximately 250° C. However, when the composition for forming an interlayer insulating film of the present invention is used, it is possible to further decrease the reaction temperature and to further improve the mechanical properties (fracture elongation).

What is claimed is:

1. A composition for forming an interlayer insulating film, comprising:
    a polymerizable monomer (M) containing a caprolactone-modified (meth)acrylate monomer;
    an imide compound (Z) represented by the following general formula (z-1);
    a reaction promoter (A) which promotes polymerization of the polymerizable monomer (M) and the imide compound (Z), wherein the reaction promoter (A) contains a Lewis acid; and
    a polymerization initiator:

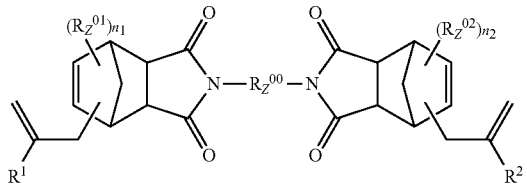

wherein $R^1$ and $R^2$ each independently represent a hydrogen atom or an alkyl group having 1 to 5 carbon atoms, $R_z^{00}$ represents a divalent organic group containing a linear, branched, or cyclic aliphatic hydrocarbon group, and/or an aromatic hydrocarbon group, $Rz_z^{01}$ and $Rz_z^{02}$ each independently represent an alkyl group having 1 to 5 carbon atoms or an alkoxy group having 1 to 5 carbon atoms, and $n_1$ and $n_2$ each independently represent 0 or 1.

2. The composition for forming an interlayer insulating film according to claim 1, wherein the content of the reaction promoter (A) is 0.1 to 10 parts by mass with respect to 100 parts by mass of the total content of the polymerizable monomer (M) and the imide compound (Z).

3. The composition for forming an interlayer insulating film according to claim 1, wherein $R_z^{00}$ in general formula (z-1) is a divalent organic group represented by the following formula ($R_z^{00}$-4), formula ($R_z^{00}$-37), or formula ($R_z^{00}$-38):

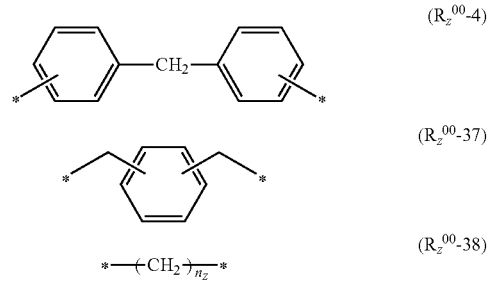

wherein $n_z$ is an integer of 1 to 10 and the symbol of "*" in the formulae represents a bond which is bonded to the nitrogen atom (N) in the formula (z-1).

4. The composition for forming an interlayer insulating film according to claim 1, wherein the imide compound (Z) contains at least one member selected from the group consisting of a compound represented by the following chemical formula (z-11), a compound represented by the following chemical formula (z-12), and a compound represented by the following chemical formula (z-13):

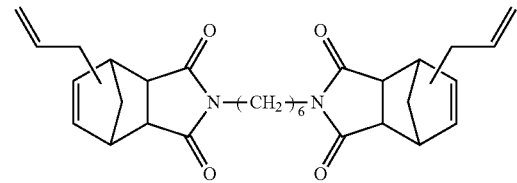

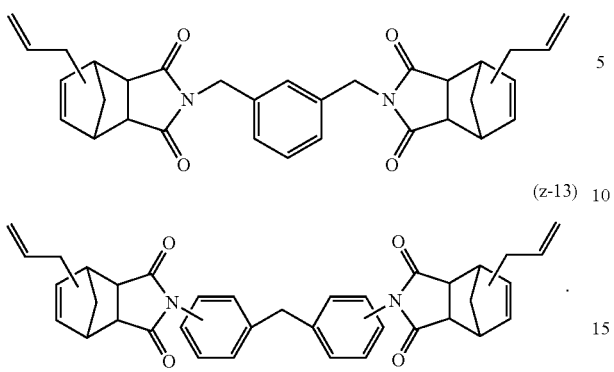

(z-12)

(z-13)

5. The composition for forming an interlayer insulating film according to claim 1, wherein the polymerizable monomer (M) contains at least one member selected from the group consisting of a compound represented by the following general formula (m-1) and a urethane monomer:

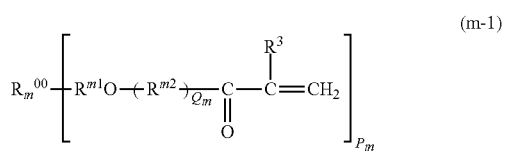

(m-1)

wherein $R_m^{00}$ represents an organic group having a valence of $P_m$, $P_m$ is an integer of 1 to 6, $R^3$ represents a hydrogen atom or an alkyl group having 1 to 5 carbon atoms, $R^{m1}$ represents an alkylene group having 1 to 5 carbon atoms, $R^{m2}$ represents a caprolactone group, and $Q_m$ is 1.

6. The composition for forming an interlayer insulating film according to claim 1, further comprising an alkali-soluble elastomer (P) containing a polymerizable group.

7. The composition for forming an interlayer insulating film according to claim 6, wherein the alkali-soluble elastomer (P) contains a polymer (P1) having a urethane bond as a main chain.

8. The composition for forming an interlayer insulating film according to claim 7, wherein the polymer (P1) is a polymer having a urethane bond as a main chain and a (meth)acryloyl group and a carboxy group as a side chain.

9. The composition for forming an interlayer insulating film according to claim 6, wherein the content of the imide compound (Z) is 5 to 50% by mass with respect to 100% by mass of the total content of the polymerizable monomer (M), the imide compound (Z), and the alkali-soluble elastomer (P).

10. An interlayer insulating film comprising a polymerized product of the composition for forming an interlayer insulating film according to claim 1.

11. A method for forming an interlayer insulating film pattern, comprising:
   applying the composition for forming an interlayer insulating film according to claim 1 on a support to form a coated film;
   exposing the coated film;
   alkali developing the coated film after the exposing to form a pre-pattern; and
   curing the pre-pattern with heat to obtain an interlayer insulating film pattern.

12. The method for forming an interlayer insulating film pattern according to claim 11, wherein the curing is performed at a temperature of 220° C. or less.

13. A device comprising a support having thereon the interlayer insulating film according to claim 10.

* * * * *